United States Patent [19]

Bridges et al.

[11] Patent Number: 4,816,426
[45] Date of Patent: Mar. 28, 1989

[54] PROCESS FOR MANUFACTURING PLASTIC PIN GRID ARRAYS AND THE PRODUCT PRODUCED THEREBY

[75] Inventors: William G. Bridges, Meriden; Thomas A. Armer, New Haven; Kin-Shiung Chang, Meriden, all of Conn.

[73] Assignee: Olin Corporation, New Haven, Conn.

[21] Appl. No.: 52,327

[22] Filed: May 21, 1987

Related U.S. Application Data

[63] Continuation-in-part of Ser. No. 16,614, Feb. 19, 1987, abandoned.

[51] Int. Cl.⁴ ............................................. H01L 23/02
[52] U.S. Cl. ................................... 437/207; 437/211; 437/219; 437/215; 264/272.11; 439/69; 439/75; 174/52.4; 174/52.2
[58] Field of Search ............... 437/207, 215; 174/50.6, 174/52 PE, 52 R; 206/347, 331, 329; 439/69, 75; 361/386; 350/96.2; 264/272.11

[56] References Cited

U.S. PATENT DOCUMENTS

| | | | |
|---|---|---|---|
| Re. 32,540 | 11/1987 | Murphy | 206/329 |
| 4,521,469 | 6/1985 | Butt et al. | 428/35 |
| 4,525,422 | 6/1985 | Butt et al. | 428/418 |
| 4,549,651 | 10/1985 | Alemanni | 206/331 |
| 4,552,422 | 11/1985 | Bennett et al. | 439/75 |
| 4,582,556 | 4/1986 | Butt et al. | 156/325 |
| 4,618,739 | 10/1986 | Theobald | 437/215 |
| 4,677,526 | 6/1987 | Muehling | 361/386 |
| 4,688,152 | 8/1987 | Chia | 361/408 |
| 4,696,526 | 9/1987 | Newton et al. | 439/68 |
| 4,712,127 | 12/1987 | Colombo et al. | 357/72 |
| 4,750,030 | 6/1988 | Hatakeyama | 357/72 |
| 4,750,092 | 6/1988 | Werther | 357/72 |
| 4,769,344 | 9/1988 | Sakai et al. | 437/216 |
| 4,706,811 | 11/1987 | Jung et al. | 206/331 |

OTHER PUBLICATIONS

How To Make Pin-Grid Arrays at Half The Cost, by Jerry Lyman, published in the Feb. 19, 1876 Issue of Electronics at p. 36.

Composite-Type Pin Grid Array Package, by K, Tsutsumi et al., published in the Dec. 1986 Issue of IEEE Transactions on Components, Hybrids, and Manufacturing Technology, vol. CHMT-9, No. 4 at p. 336.

*Primary Examiner*—Brian E. Hearn
*Assistant Examiner*—Beverly Pawlikowski
*Attorney, Agent, or Firm*—Gregory S. Rosenblatt; Paul Weinstein

[57] ABSTRACT

A process for forming an integral circuit pin grid array package comprising a flexible metal tape adapted for use in tape automated bonding with a plurality of holes. Terminal pins are inserted in the holes and the tape and pins are disposed within a mold so that a cavity is formed about the pins and tape. The cavity is filled with a polymer resin so as to at least partially surround and support the pins and tape and thereby form the plastic encapsulated pin grid array.

25 Claims, 13 Drawing Sheets

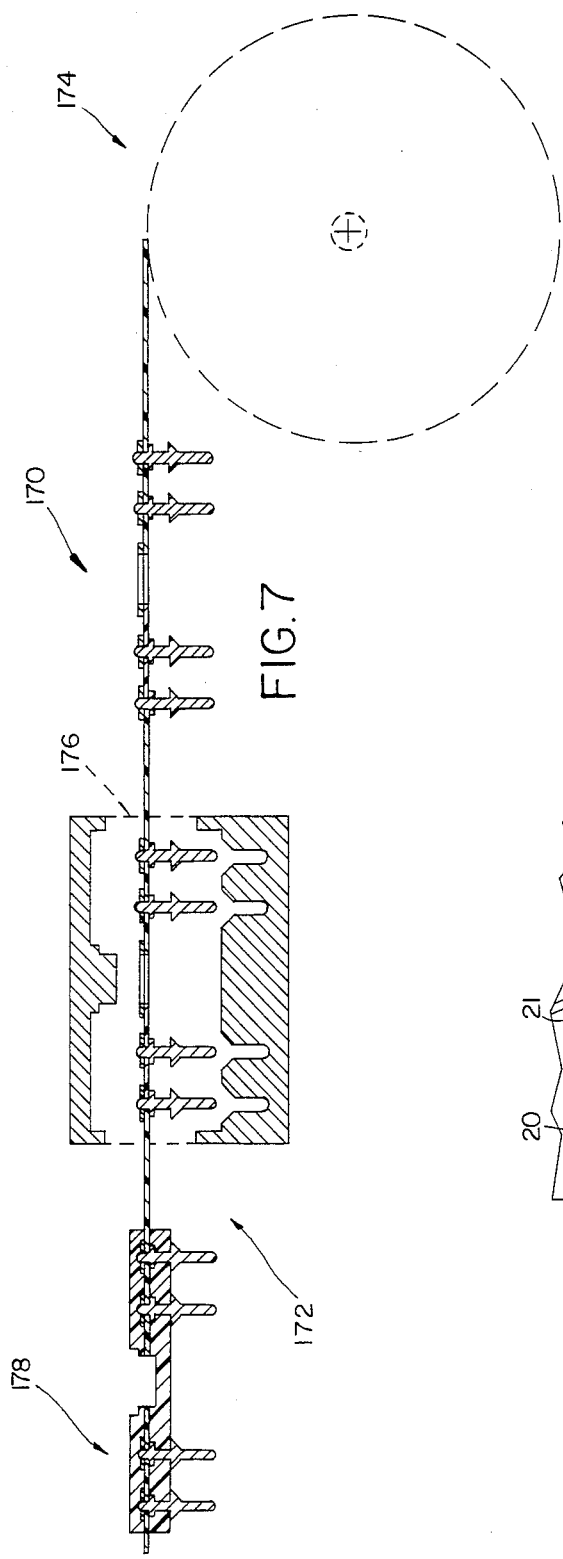
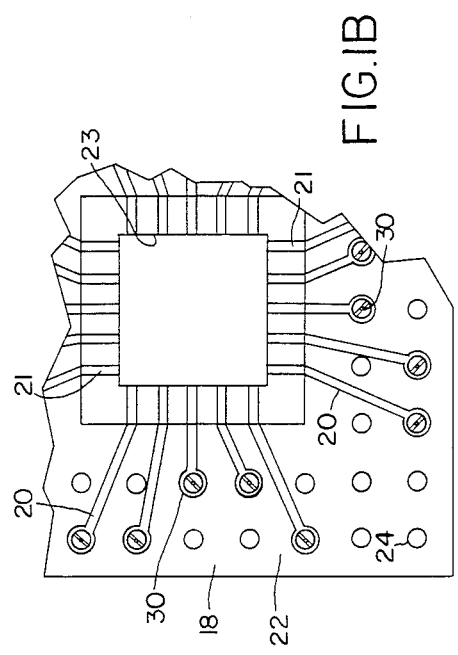

PROCESS FOR MANUFACTURING PLASTIC PIN GRID ARRAYS AND THE PRODUCT PRODUCED THEREBY

This application is a Continuation-In-Part of Ser. No 16,614, (now abandoned) filed Feb. 19, 1987, by William G. Bridges et al. for "Process For Manufacturing Plastic Pin Grid Arrays And The Product Produced Thereby".

While the invention is subject to a wide range of applications, it particularly relates to both the process of constructing plastic pin grid arrays and the resulting product thereof. In particular, the disclosed plastic pin grid array includes tape automated bonding (TAB) tape having terminal pins electrically connected thereto and encapsulated within a polymer resin.

In the past, pin grid arrays were manufactured in plastic or ceramic packages. Plastic pin grid arrays were typically produced using printed wiring board (PWB) substrates having small printed circuit patterns connecting the bonding pads on the integrated circuit chip to the input-output (I/O) pins. Multiple layers of these printed circuit patterns were stacked and bonded together to form a package which could provide complex interconnects and an increased number of I/O pins.

The plastic packages have several important physical characteristics which significantly improve the operation of the packaged integrated circuit chip as compared with the operational characteristics of ceramic packages. These characteristics include higher current carrying capacity, lower dielectric constant for shorter operational delay times, and reduced inductance and capacitance. Moreover, the circuitry of the PWB substrates is extremely accurate and highly conductive since it can incorporate a metal foil with photodefined circuitry. By contrast, the ceramic packages incorporate circuitry which is fabricated from low conductivity metallization and cannot be as accurately defined.

One disadvantage of the PWB substrates is the requirement for through hole drilling and plating to connect the pins to the circuitry. This results in a more expensive manufacturing procedure.

The present invention incorporates TAB procedures for bonding individual lead ends to the I/O terminal pads located on the active surface of an integrated circuit chip. The TAB tape is typically of three general forms of construction. The first is a single layer of all metal construction; the second is a two layer construction comprising a metal layer with a dielectric backing such as a polyimide; and the third is a three layer construction comprising a metal layer adhesively bonded to a dielectric, such as a KAPTON polyimide.

The formation of plastic injection molded pin grid arrays is illustrated on Page 10 of the newsletter entitled Semiconductor Packaging Update, Vol. II, No. 1, January, 1987. The pin grid array illustrated in that article does not appear to have the interconnected circuitry molded within the thermoplastic resin as in the present invention. Further, it does not appear that the terminal pins project through the circuitry. Encapsulating the pins on both sides of the circuitry is an important aspect of the present invention because the interconnection between the pins and the circuitry is strengthened and environmentally protected after encapsulation with a polymer resin.

The formation of ceramic pin grid array packages incorporating a TAB tape is disclosed in the article entitled "Composite Type Pin Grid Array Package", by Tsutsumi et al. set out in 1986 IEEE, Page 560–563. As illustrated in FIG. 2, a ceramic base has I/O pins projecting therefrom. A polyimide film with wiring paths of copper has via holes for the I/O pins. The polyimide film is placed over the pins and adhesively bonded to the base. Then, the pins are soldered to the wiring paths. Finally, a cap having via holes for the I/O pins is adhesively bonded to the base and film. In this approach, the pins and tape are not encapsulated together but are adhesively bonded between a ceramic cap and base.

A plastic chip carrier package is disclosed in U.S. Pat. No. 4,618,739. The terminal pins are incorporated in a base component by a process such as plastic injection molding. A metallized plastic tape is bonded onto the base component and the pins are joined to the tape metallization by any desired technique such as welding. To facilitate the joining, through holes in the metallized plastic tape are positioned at the points of contact with the ends of the terminal pins. The throuqh hole openings permit joining the metallized tape with the terminal pin ends by techniques such as laser welding. A plastic cover may be adhesively bonded to the base component. The aforementioned pin grid array is formed of plastic as is the package of the present invention. However, the metallized tape dies not have the pins protruding therethrough is order to facilitate interconnection between the metallized tape and the terminal pins. Also, the metallized tape is not encapsulated by the plastic but rather adhesively bonded thereto The aforenoted problems and difficulties can readily be overcome with this invention wherein the terminal pins are inserted through the TAB tape. Then, after electrically interconnecting the pins to the tape, the pins and tape are encapsulated together with a polymer resin. This one step encapsulating process can be readily carried out with automatic equipment, if desired, and results in a high reliability package wherein the bonds between the pin and tape are encapsulated and, therefore, reliable and less subject to deterioration.

It is an aim of the present invention to provide an integrated pin grid array package and the process of forming an integrated circuit pin grid array package which avoids the problems and difficulties encountered by the prior art approaches.

It is a further aim of the present invention to provide an integrated pin grid array package and the process of forming an integrated circuit chip carrier package which can be assembled using a low cost, efficiently operated automated assembly.

It is a yet further aim of the present invention to provide an integrated pin grid array package and the process as above wherein a TAB tape, having an integrated circuit chip bonded thereto, is testable prior to molding.

It is a yet further aim of the present invention to provide an integrated pin grid array package and the process of forming an integrated chip carrier package which is simple to carry out using a single molding step.

It is a still further aim of the present invention to provide a pin grid array adapter package and the process of forming a pin grid array adapter package which is relatively inexpensive to manufacture with a single molding step.

These and other aims will become more apparent from the following description and drawings in which like elements have been given like reference numbers and in which primed or multiprimed number comprise similar elements providing similar functions.

FIG. 1B illustrates a partial top view of an interconnect tape having the leads forming the circuit pattern extending from terminal pins to the edge of an aperture cut through the tape;

FIG. 7 illustrates a reel to reel operation wherein an interconnect tape having the pins locked on is encapsulated in a mold and rerolled onto a reel;

Figure 1A:
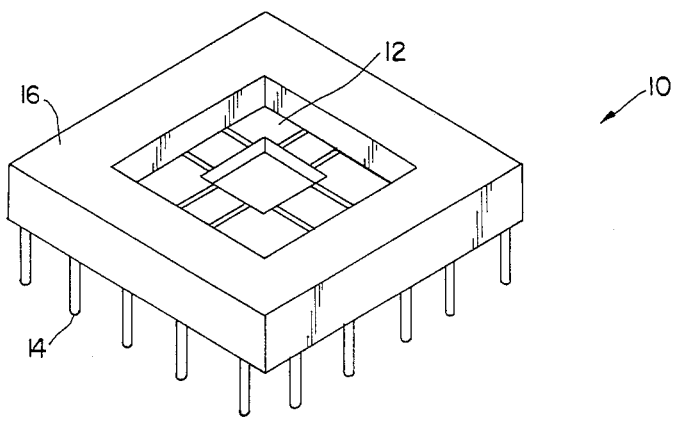
FIG. 1A illustrates an isometric view of a plastic integrated circuit pin grid array package having a plurality of encapsulated terminal pins extending therefrom.

The present invention is particularly directed to an integrated circuit pin grid package 10, an example of which being illustrated in FIG. 1A, and process of forming the package 10 whereby a TAB tape 12 having terminal pins 14 extending therethrough are encapsulated within a polymer resin 16. There are three general forms of TAB construction. The first is a single layer or all metal construction; the second is a two layer construction comprising a metal layer with a dielectric backing such as a polyimide; and the third is a three layer construction comprising a metal layer adhesively bonded to a dielectric such as KAPTON polyimide. The TAB tape has a plurality of holes formed therein through which terminal pins are inserted. The embodiments of the present invention will preferably incorporate the two or three layer construction tape.

Figure 2B:
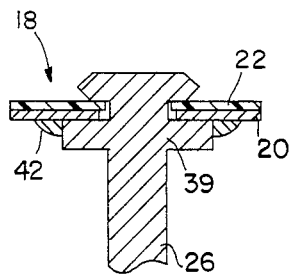
FIG. 2B is a side view in cross section of a terminal pin connected to a TAB tape which is inverted as compared to the tape in FIG. 2A.
Figure 2A:
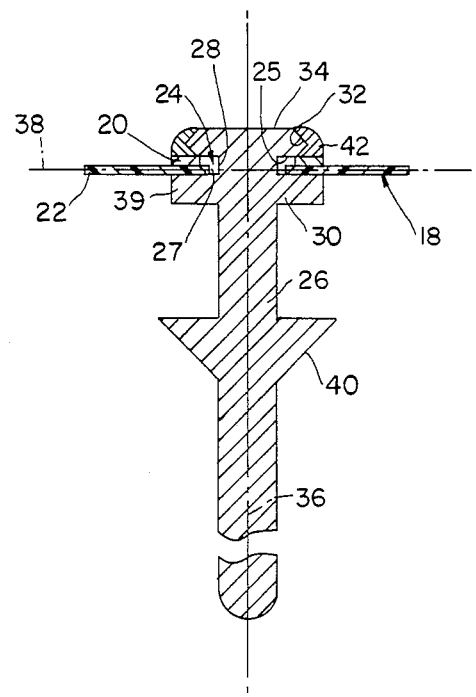
FIG. 2A is a side view in cross section of a terminal pin connected to a TAB tape.

Referring to FIGS. 1B, 2A and 2B, there is illustrated an interconnect tape 18 defining a metal interconnect circuit pattern or layer 20 adhesively bonded to a dielectric layer 22. The metal interconnect pattern layer 20 may be formed of any desired material, such as for example, copper or copper alloy while the dielectric layer 22 may be formed of any dielectric material, such as a KAPTON polyimide. The interconnect or TAB tape 18 has at least one and typically a plurality of holes 24 formed therein to receive terminal pins 26. Preferably, the holes 24 in the interconnect tape 18 are sized for the tape 18 to mechanically interlock with a groove or slot 28 in the pinhead 30. The holes 24 may be formed of a hole 25 in the metal layer 20 and a hole 27 in the plastic layer 22 by any suitable technique, such as photoetching, stamping or a combination thereof. The diameter of the hole 24 is preferably the same in both the metal and plastic layers 20 and 22, respectively. If desired, it is within the terms of the present invention to form the diameter of the hole 27 in the plastic layer 22 to be slightly less than that of the hole 25 in the metal layer 20. It is thought that the diameter of the hole 27 in the plastic layer 22 may be up to about 33% smaller than the hole 25 in the metal layer 20. Preferably, the hole 27 is up to about 10% smaller than hole 25. A smaller hole 27 in the plastic layer 22 will provide a tighter connection to the pin 26 while decreasing the chance for crimping of the metal layer 20 where the pin head is inserted into the tape hole 24.

The pin head 30 of pin 26 preferably has a V-shaped configuration 32 between the slot 28 and the top surface 34 of pinhead 30. The V-shaped configuration 32 is formed whereby insertion of the pin 26 into the hole 24 does not crimp the tape 18. Although a V-shaped configuration of the pin is illustrated, it is within the terms of the present invention to shape the pin head 30 in any desired configuration to ease the insertion of the pin 26 into the hole 24. For example, the pinhead 30 may have a curved or cylindrical shape. The pin head 30 is preferably slightly greater in diameter than the diameter of the holes 24. Preferably, the largest outside diameter of the pin head 30 is from about 5 to about 15 percent larger than the inside diameter of the hole 25 in the metal layer 20. The outer diameter of the pin head 30 is larger than the inside diameter of the hole 25 to insure electrical contact with the metal layer 20. At the same time, if the outer diameter of the pin head 30 is too large, i.e. over about 15% greater than the diameter of the hole 25, the metal of the metal layer 20 will become crimped and possibly tear. It should also be realized that the outer diameter of the pin head 30 should be large enough so that the terminal pins can be carried with sufficient contact area of the tape that the tape is not bent. It is also within the terms of the present invention to form the outer diameter of the pin head 30 with the same or a smaller diameter than that of the holes 24. Once the pin 26 is inserted into the TAB tape 18, it is carried with its centerline 36 substantially perpendicular to a plane 38 which extends through the TAB tape 18.

Figure 3A:
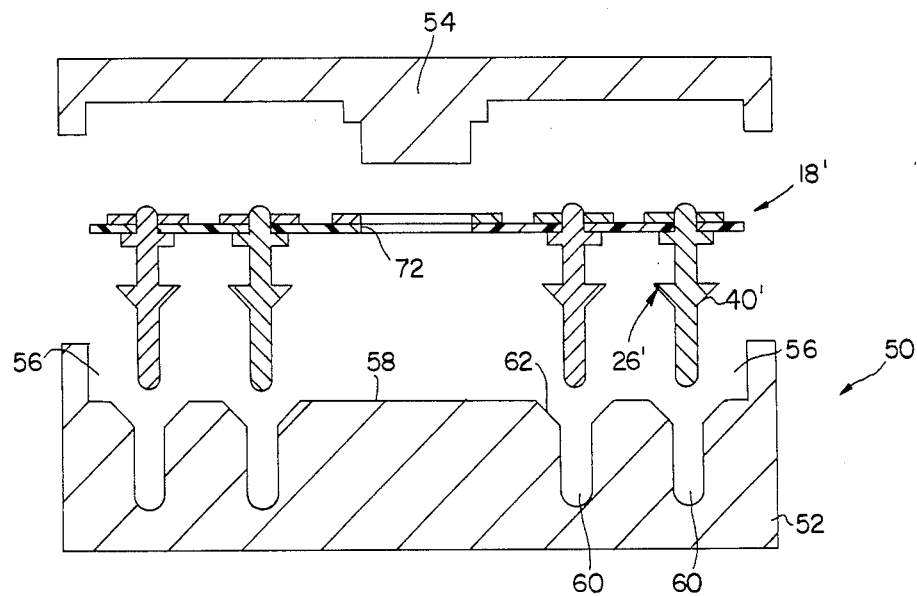
FIGS. 3A through 3E illustrate the series of steps for molding a TAB tape with terminal pins extending therethrough into a plastic integrated circuit pin grid array package in accordance with the present invention.

The terminal pins 26 may also include a shoulder or collar 39 which forms a seat for the terminal tape 18. The collar 39 serves as a stop to lock the tape 18 into the groove 28. In addition, the collar 39 acts to support the tape 18. In FIG. 3A, the tape 18 is disposed in the slot 28 so that the dielectric layer 22 is in contact with the shoulder 39. The orientation of the tape 18 to the pin 26, as illustrated in FIG. 2A, may be used in each of the embodiments described herein. However, it is also within the terms of the present invention to invert the tape 18 with respect to the pin 26, as shown in FIG. 2B. In this embodiment, the metal layer is in direct contact with the shoulder 39 of pin 26. Good electrical connection between the tape 18 and the terminal pin 26, without further bonding, may result from this orientation. Also, the tape 18 may be bonded, by means such as solder 42, to the collar 39 of pin 26. The pins 26 may also include a tapered cone shaped wall 40 to self-center the pin 26 within a hole in a mold, as explained herein.

Referring to FIG. 1B, there is illustrated a partial top view of an interconnect tape 18 defining a metal interconnect circuit pattern 20. The tape 18 includes a plurality of holes 24 extending therethrough. Any number of holes may be provided. The circuit pattern 29 defines a plurality of leads 21. These leads extend at least to an aperture 23 which extends through the tape 18. Terminal pins 26 extend outward from the surface of the interconnect tape 18. In FIG. 1B, the pinheads 30 are illustrated as being connected to the circuit pattern.

After the pin 26 has been inserted into the interconnect tape 18, it is preferably locked into the hole 24 to insure mechanical continuity and electrical contact between the pin 26 and the metal circuit layer 20. To further insure electrical continuity, the tape may be bonded to the pins 26 by any conventional means, such as soldering, brazing or welding. In the preferred embodiment, the pinhead 30 is coated with a solder 42. Also, the metal layer 20 adjacent the pinhead 30 maybe coated with a solder. A solder flux maybe provided on either the tape 18 or the head 30 of the pin 26 to enhance the flow of solder 42 between the pinhead 30 and the tape 18. The soldering may be accomplished by reflowing the solder on the pin 26 and the tape 18 by any conventional heat application technique such as with hot air, vapor reflow, infared rays or with a laser. The solder 42 melts and upon solidification bonds the pinhead 30 to the metal layer 20 of tape 18. In order to insure the proper positioning of the pin 26 with respect to the tape 18, the pins 26 may be inserted in a fixture or a jig, not shown, prior to soldering, so that the pins 26 are properly aligned both with respect to each other and to the tape 18.

Subsequent to the removal of the tape 18' from the jig., the tape 18' and the pins 26' are loaded into a mold 50 as shown in FIG. 3A. In this approach, the tape 18' serves as a carrier for the insertion of the pins 26' into the mold 50. The mold includes a base component 52 and a cover componnent 54, both of which may be constructed of any desired material, such as a metal such as steel. The base component 52 has a recess 56 having a first base surface 58. A plurality of holes 60 extending from the first base surface 58 are formed within the base component 52. The holes 60 may include a cone shaped section 62 which are sized to receive the walls 40' of the pins 26'. The cone shaped walls 40' are seated in the cone-shaped section 62 to ensure that the pins 26' are properly aligned within the mold 50.

Figure 3B:
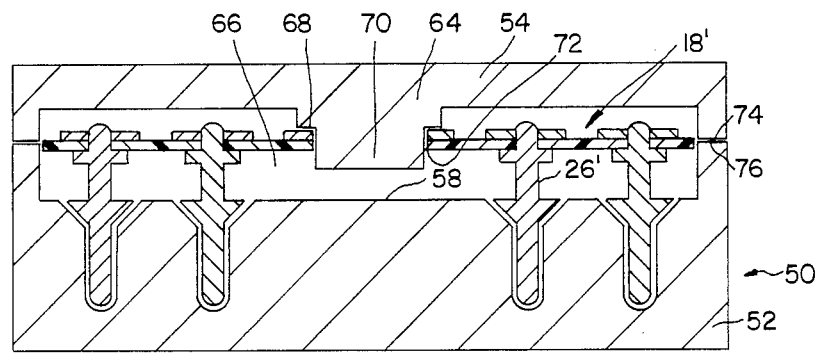

As illustrated in FIG. 3B, the tape 18' is supported above the base surface 58 of the base component 52 by the pins 26'. The cover component 54 is now clamped into position on base component 52. The cover component 54 includes a projection 64 which projects into a cavity 66 formed between the base component 52 and the cover component 54. The projection 64 has an outward extending surface 68 in contact with the tape 18'. The first projection 64 also includes a central portion 70 which extends through an aperture 72 in the tape 18'. An outer surface 74 of the cover component 54 abuts against the surface 76 of the base component 52 and closes mold 50 to form the cavity 66 about the pins 26' and the tape 18'.

Figure 3C:
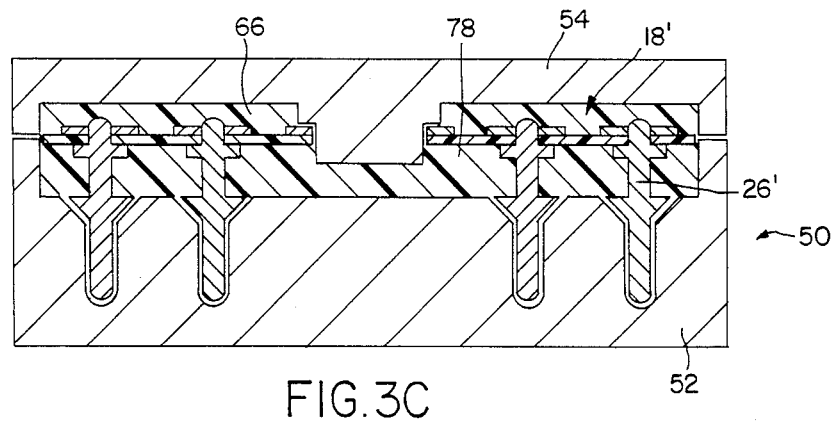

The cavity 66 is then filled, as illustrated in FIG. 3C, with a polymer resin 78 so as to at least partially surround and support the pins 26' and the tape 18'. The polymer resin 78 enters the cavity 66 is filled by the organic through molding passageways (not shown) which extend through the base and/or cover components 52 and 54, respectively, at any desired locations.

The organic polymer resin is selected from the group consisting of thermoset and thermoplastic polymer resins. The thermoset polymer resin maybe selected from the group consisting of epoxies, 1-2 polybutadienes, silicone, poly(bismaleimides) and polyimide polymers. Each of these polymers may be filled, if desired, to change the dielectric constant, the coefficient of thermal expansion and the cost of the resulting polymer mixture. The filler may include materials, such as for example, fumed silica, ceramic or quartz. The thermoset epoxy resins typically have a low viscosity and a processing temperature of about with 170° to about 300° C. The thermoplastic polymer resin maybe selected from the group consisting of polyphenylsulfide, polysulfone, polyarylether, polyamide, polyether ketone, polyethersulfone, polyetherimide and fluoropolymers. The thermoplastic polymer resin maybe filled or unfilled for the reasons and with the materials as discussed regarding the thermoset resin. The thermoplastic typically has a high viscosity and a processing temperature of above about 220° C. and preferably from about 220° to 400° C. Although specific groups of thermoplastic and thermosetting organic polymer resins have been disclosed, it is within the terms of the present invention to use any organic adhesive capable of encapsulating the interconnect tape and the pins of the pin grid array packages disclosed herein.

To carry out the present invention, a transfer molding technique using polymeric material at a pressure which is usually less than about 1000 pounds per square inch (psi) is preferable. The present invention preferably incorporates transfer molding since the lower pressure required for the process decreases the probability of damaging the electrical connections during the molding step. It is, however, within the terms of the present invention to use any other molding technique, such as injection molding, where a high viscosity polymer is injected using a relatively high pressure of over about 2000 psi. Usually, thermoplastics are molded using the latter technique. However, it is within the terms of the present invention to transfer mold a thermoset or injection mold a thermoplastic. One difference between the thermoset polymers and the thermoplastic polymers is that the former require a curing time.

Figure 3D:
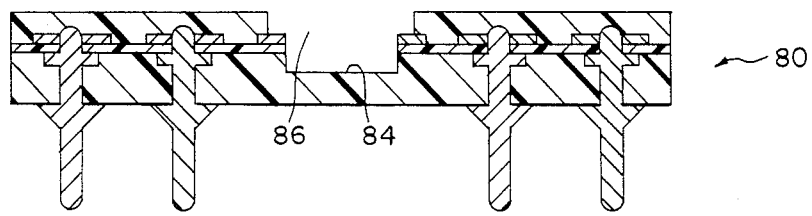

After the polymer resin has filled the mold cavity 66 and has hardened or cured, the resulting integrated circuit pin grid array package 10 is ejected from the mold 50. This may be accomplished by pins extending through the mold (not shown) which may be operated by means such as hydraulic, to push the package 80 out of the mold 50. The finished package 80, as seen in FIG. 3D, may now be trimmed and polished as required.

To prevent the package from sticking to the mold, a mold release agent may be coated on the mold walls prior to injection of the organic polymer. The specific mold release agent is selected in accordance with the particular organic polymer being used. For example, a polyimide may require a zinc stearate or fatty acid mold release agent.

The package 80 may now have an integrated circuit chip device 82 bonded onto the bottom surface 84 of a recess 86. The chip device 82 is then electrically connected to the leads 88 formed of the metal paths extending from the terminal pins 26' to the recess 86. This electrical interconnection may be made by any conventional technique, such as for example, thermosonic or thermocompression bonding.

An advantage of the present invention is that the chip 82 and its lead connections can be tested prior to the final assembly of the package 80. Preferably, the testing step would occur prior to the sealing of a cover 90 onto the package 80.

Figure 3E:
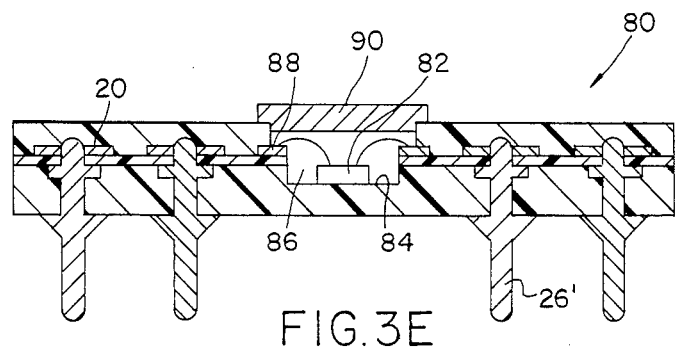

The package 80, as seen in FIG. 3E, may now be sealed within the recess 86. The sealing means may incorporate a cover component 90. The cover component 90 may be constructed of a material selected from the group consisting of metals, alloys, glass, ceramics, organic polymers and combinations thereof. The cover component 90 is sealed into the package 80 to cover recess 86 by any desired means, such as for example by an epoxy adhesive. It is also within the terms of the present invention to fill the recess 86 with a sealing material such as a thermoset or thermoplastic organic polymer as described hereinbefore.

Figure 4A:
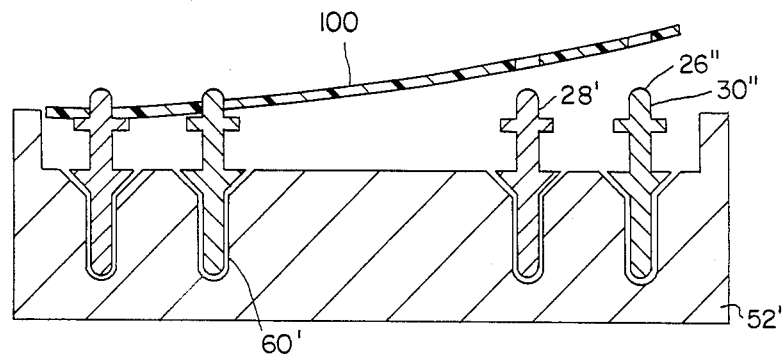
FIGS. 4A through 4F illustrate the steps for molding a plastic integrated circuit pin grid array package of the type illustrated in FIGS. 3A through 3E wherein the pins are inserted into a mold prior to their connection to the TAB tape.

Referring to FIGS. 4A through 4F, there is illustrated a series of steps for forming an intergrated circuit pin grid array package 80' wherein the terminal pins 26" are inserted into the holes 60' in the mold base component 52' prior to the insertion of the terminal pins 26" into the TAB tape 18". Preferably, the terminal pins 26" are positioned and affixed to a MYLAR or KAPTON carrier 100 by the grooves 28' in the pin heads 30" as illustrated in FIG. 4A. The pins 26" are essentially the same as illustrated in FIG. 2 except shown without all of the specific details. This method of carrying pins is described in U.S. Pat. No. 4,442,938. The terminal pins 26" while still being held by the carrier 100 are inserted into the holes 60'. The holes 60' are sized to hold the pins 26" while the carrier 100 is being peeled off as shown in FIG. 4A. It is also within the terms of the present invention to insert the terminal pins 26" into holes 60' by any desired technique, such as, for example, by hand.

Figure 4B:
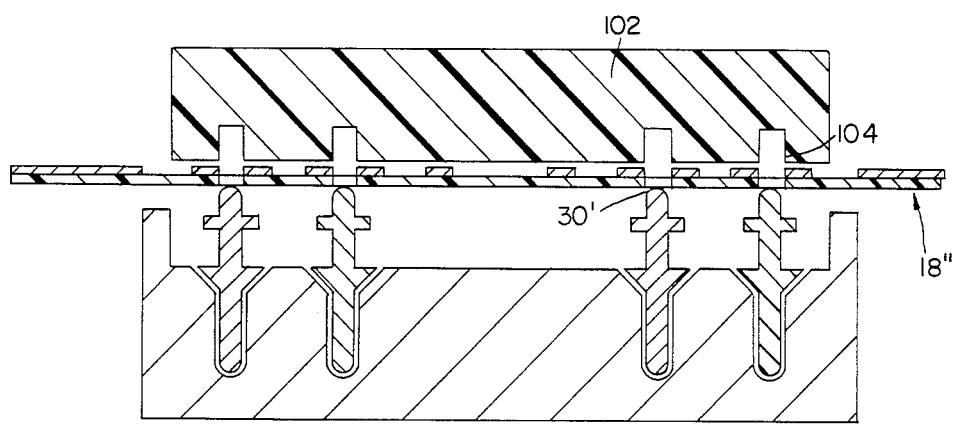

Once the terminal pins 26" are positioned in the base component 52', a TAB 18" is positioned over the pins 26" as seen in FIG. 4B. The tape 18" maybe pulled from a reel to increase the automation of the process. Then, the tape 18" is pressd onto the pins 26" by a fixture 102 which includes holes or slots 104 to accommodate the pin heads 30'. The fixture 102 may be constructed of any material such as a hard rubber in order that it does not damage the tape 18".

Figure 4F:
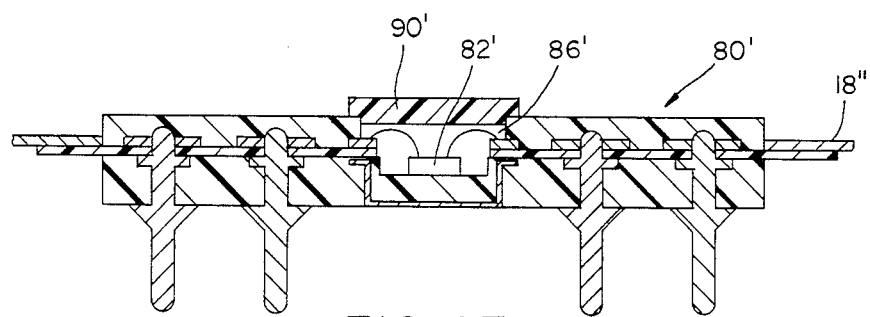
Figure 4C:
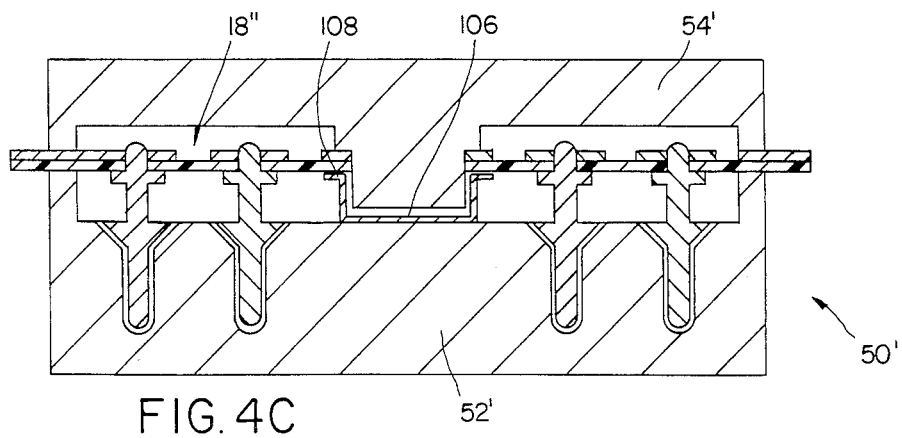
Figure 4D:
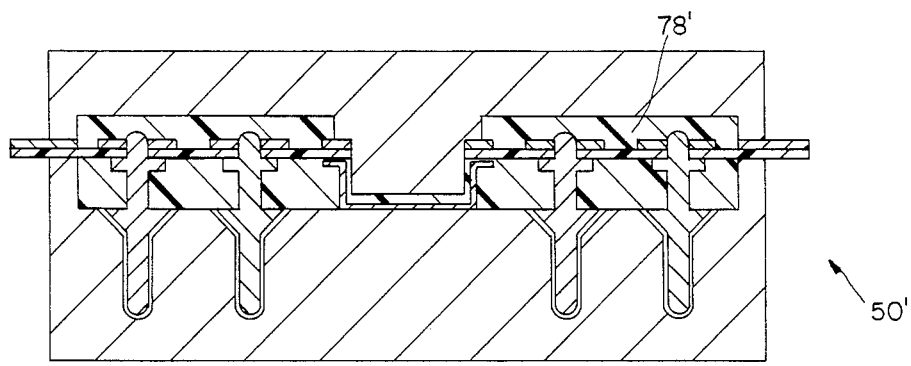
Figure 4E:
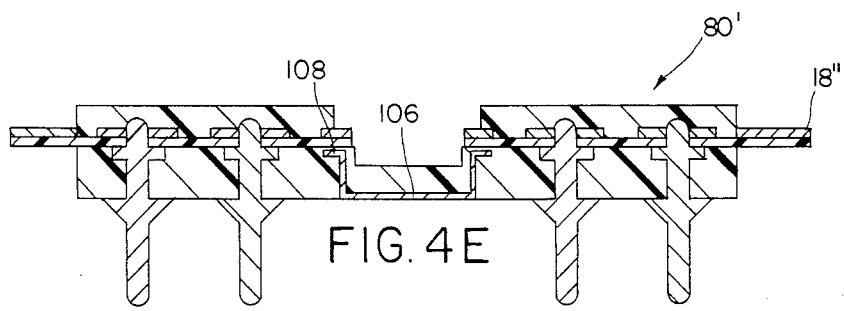

The cover component 54' is then disposed on the base component 52', as illustrated in FIG. 4C in order to close the mold 50'. In this embodiment, the ends of the tape 18" project from the sides of the mold 50'. A heat sink cup 106 is also incorporated in the mold to be encapsulated into the final package 80'. The heat sink cup 106 may have any desired shape and be provided with cooling fins if desired. The heat sink cup 106 is provided with a collar 108 to support the tape 18". The collar support may be particularly beneficial during the molding of the polymer resin in the mold. The heat sink may also be incorporated in any of the embodiments disclosed herein. Then, as described in the series of process steps 3C through 3E, the mold 50' is illustrated as being filled with a polymer resin 78' in FIG. 4D, the package 80' is shown ejected from the mold 50' in FIG. 4E and a lid 90' seals a chip or device 82' in FIG. 4F.

The package 80', as illustrated in FIG. 4F, has the tape 18" projecting from the finished package 80'. This enables the tape 18", with the pins 26" andchip 82' encapsulated thereon, to be further processed while being carried on the tape 18". It is also within the terms of the present invention to trim off the ends of the tape 18" which project from the package 80' either before or after the recess 86' in package 80' has been sealed. Also, it is within the terms of the present invention for each of the embodiments described within this specification to be molded with the interconnect tape extending from the mold, if desired.

Figure 5A:
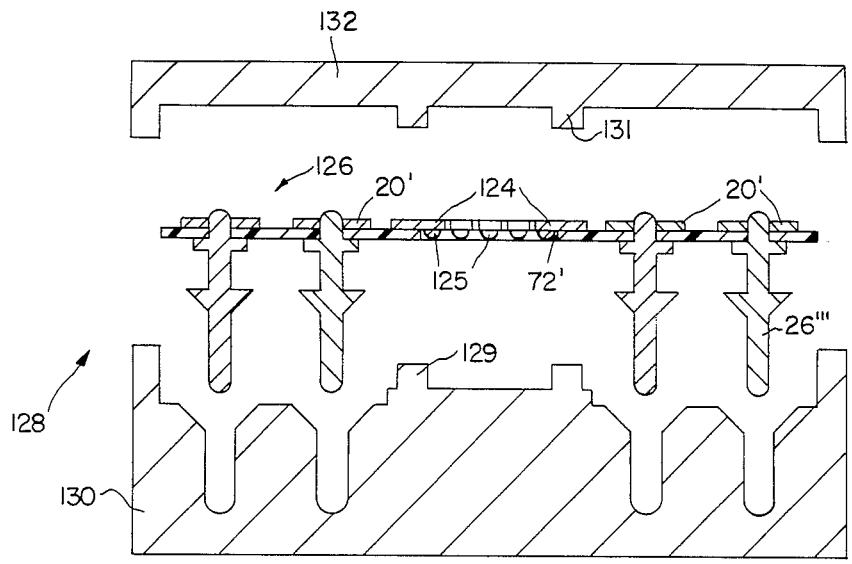
FIGS. 5A through 5E illustrate the series of steps to form a second embodiment of a plastic integrated circuit pin grid array package.
Figure 5B:
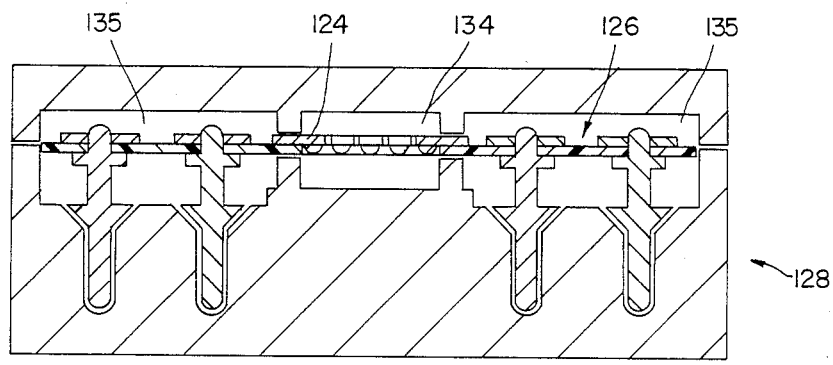
Figure 5C:
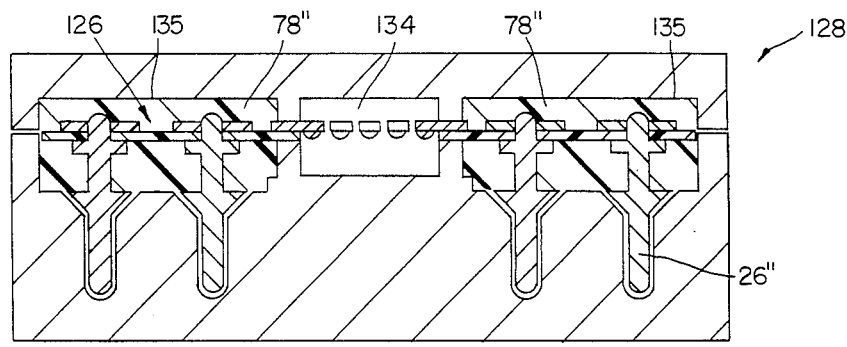
Figure 5D:
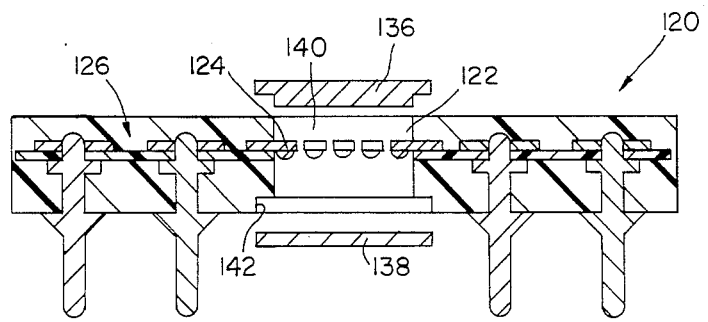

Referring to FIGS. 5A–5E, there is illustrated the series of steps for constructing a second embodiment of an integrated circuit pin grid array package 120. The completed package 120, as illustrated in FIG. 5D, has a centrally disposed integrated circuit device connect recess or cavity 122 extending therethrough. The leads 124 which are an integral part of interconnect tape 126 extend into the connect recess 122.

As illustrated in FIG. 5A, the mold 128 used to construct the package 120 is substantially the same as the mold 50 described herein before. The primary differences reside in the addition of a projection 129 on the mold base component 130 and a projection 131 on the mold cover 132. When the mold 128 is closed as illustrated in FIG. 5B, the projections 129 and 131 abut each other with the tape 126 disposed therebetween. The mold 128 now forms a centrally disposed chip connect recess 144.

The interconnect tape 126, as illustrated in FIG. 5A, is essentially the same as the tapes 18 and 18' described hereinbefore. The pins 26 ." are schematic representations of the pin 26 illustrated in FIG. 2. The difference between tapes 18 and 18' resides in the provision of leads 124 which extend over the aperture 72' in cantilever fashion. The leads 124 which are an integral part of the metal interconnect circuit pattern 20' are illustrated with bumps 125. However, it is within the terms of the present invention to form the bumps on the integrated circuit device 82" and form the leads without bumps 125. Also, the leads may be plated as required. For example, they may be gold plated over a nickel barrier layer. Further, any portion of the the circuit pattern 20' may also be plated as required. It is also within the terms of the present invention for the tape 126 to be inverted with respect to the terminal pins 26'". In that case, bumps 125 on the leads 124 project towards the base component 130 but do not extend into the aperture 72' formed in the tape 126. As illustrated in FIGS. 5A through 5E, the leads may project from any side of the package 120 into the recess 134.

Once the tape 126 and the terminal pins 26" are positioned in the mold 128, an organic polymer resin 78" fills the mold cavity 135 as illustrated in FIG. 5C. The projections 129 and 131 prevent the polymer 78" from filling the recess 134. Then the package 120 is ejected from the mold 128 using any desired means such as hydraulically actuated pins (not shown).

The package 120 has the connect recess 122 sealed after the integrated circuit device has been bonded to the device 82". As shown in FIG. 5D, this may be accomplished with lid and base, caps 136 and 138, respectively. The caps 136 and 138 may be formed of any desirable material such as the material used to construct lid 90. The caps 136 and 138 seal the openings 140 and 142, respectively, to the cavity 122. The caps 136 and 138 may be sealed to the package 120 by any desired means, such as with an organic polymer. It is also within the terms of the present invention to seal the recess 122 with any other means such as an polymer as described herein.

Figure 5E:
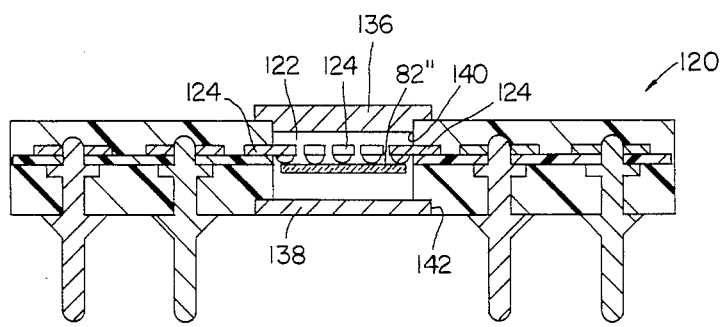

The cavity 122, which extends through the package 120, enables an integrated circuit chip assembly 82″ to be bonded to the TAB tape 126 using TAB bonding techniques. A heated pedestal, not shown, may be inserted through the opening 142 in the package 120 to provide a heated support for chip 82″. Then, a thermode of a TAB bonding machine, not shown, may be inserted through the opening 142 to bond the bumped leads to the chip device 82″. As illustrated in FIG. 5E, after the chip 82″ is bonded to the leads 124, the caps 136 and 138 are preferably adhesively sealed into the openings 140 and 142, respectively, to seal the cavity 122.

Referring to FIGS. 6A through 6D, there is illustrated a process for forming a third embodiment of an integrated circuit pin grid array package 150. The tape 124′ has an integrated circuit device 82‴ bonded thereto by any means such as with a TAB bonding technique. Then, the tape 124′ also has the terminal pins 26″ locked thereto and, if desired, connected by means such as soldering, as described herein. The tape 124′ serves as a carrier to position the pins 26″ in the holes 60′ of the base component 157.

Figure 6A:
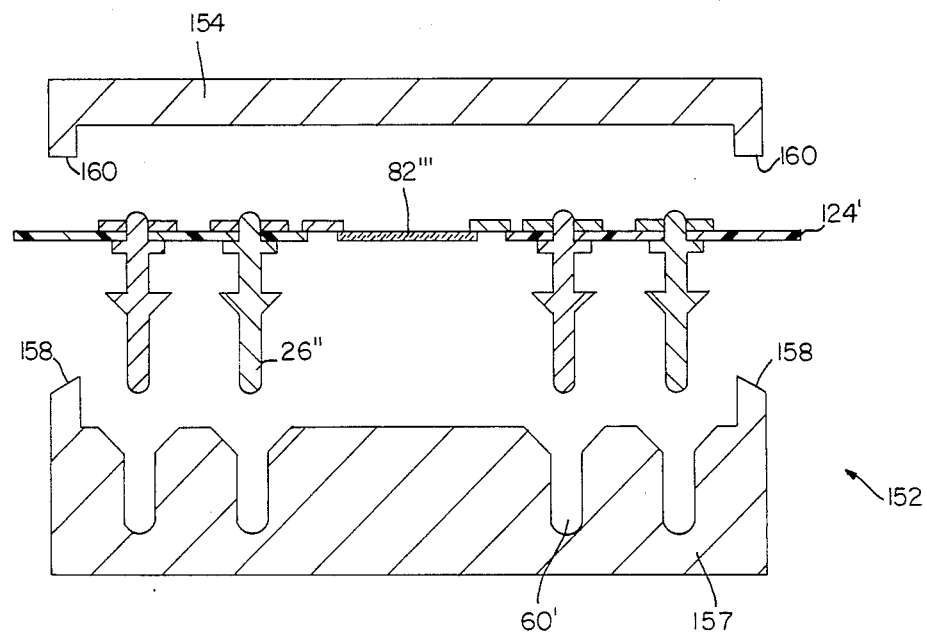
FIGS. 6A through 6D illustrate the series of steps to form a third embodiment of a plastic integrated circuit pin grid array package wherein an integrated circuit device is bonded to a TAB tape having terminal pins extending therethrough and the tape with the pins and integrated circuit are encapsulated in a plastic polymer resin.
Figure 6B:
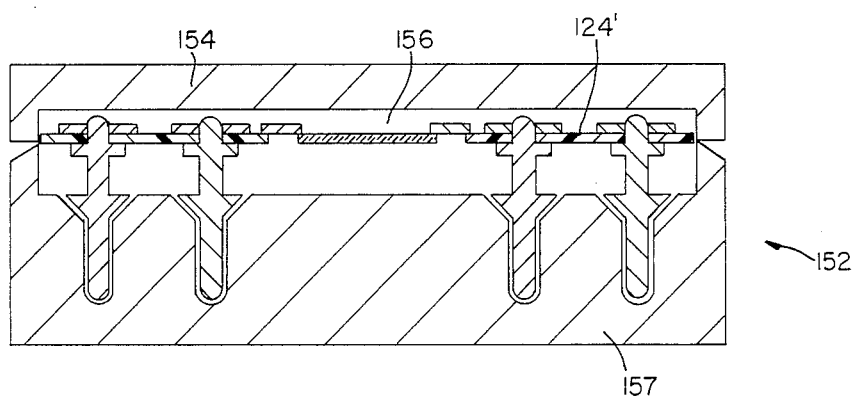
Figure 6C:
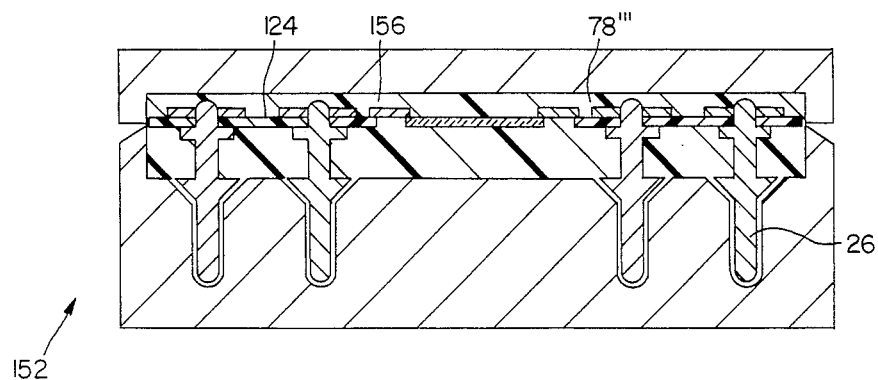
Figure 6D:
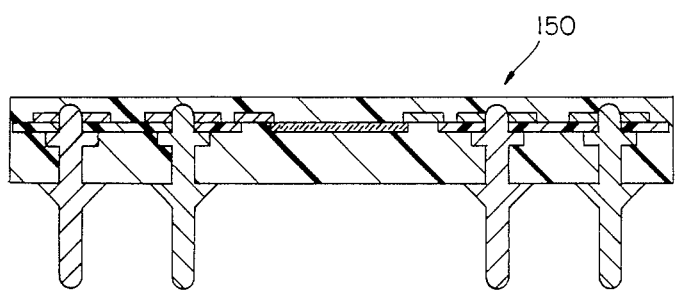

The package 130 is formed in a mold 152 which is similar to the mold 50 used to form the package 80 of the first embodiment. The primary difference is that the mold cover 154 is shaped to form a cavity 156 when abutted against mold base component 157, as illustrated in FIG. 6B. When the cavity 156 is filled with the organic polymer 78‴, as illustrated in FIG. 6C, the tape 124′, including the chip 82‴ and the terminal pins 26″ are encapsulated by a polymer resin 78‴. The mold 152 also enables the tape 124′ to be severed after the tape has been disposed within the mold 152. The mold base 157 has a cutting edge 158 which contacts the surface 160 of the mold cover 154. After the tape 124′ is pulled into the mold 152, typically from a reel, the mold 152 closes and shears off the tape 124′, as illustrated in FIG. 6B. Then, the polymer 78‴ will flow around the edges of the tape 124′ so that the final package 150 completely encapsulates the tape 78‴ and the chip device 82‴. Complete encapsulation may be important to diminish the opportunities for atmospheric exposure to the tape 78‴. Although a particular cutting technique has been illustrated, it is within the terms of the present invention to use any means associated with the mold 152 to cut the tape 78‴ after the latter has already been placed within the mold 152. This technique of cutting the TAB tape during the step of closing the mold is applicable to any of the the other mold configurations discussed hereinbefore.

Referring to FIG. 7, there is shown a schematic illustration of an automatic assembly line 170 for inserting interconnect tape having terminal pins attached thereto into a mold 172. The tape having the pins attached is rolled off a reel 174, schematically illustrated. The tape layers may be separated from each other on the reel 174 by means of inserts. After the tape enters the mold 172, the mold closes as indicated by the dotted lines 176 and the mold is filled with a polymer. Then the mold opens and the package 178 is ejected and moved downstream to another reel, not shown, which is essentially the same as reel 174. It is also within the terms of the present invention to insert the pins in the mold and then lock them onto the tape, to cut the tape in the mold or to perform any other of the processes described hereinbefore.

Figure 8A:
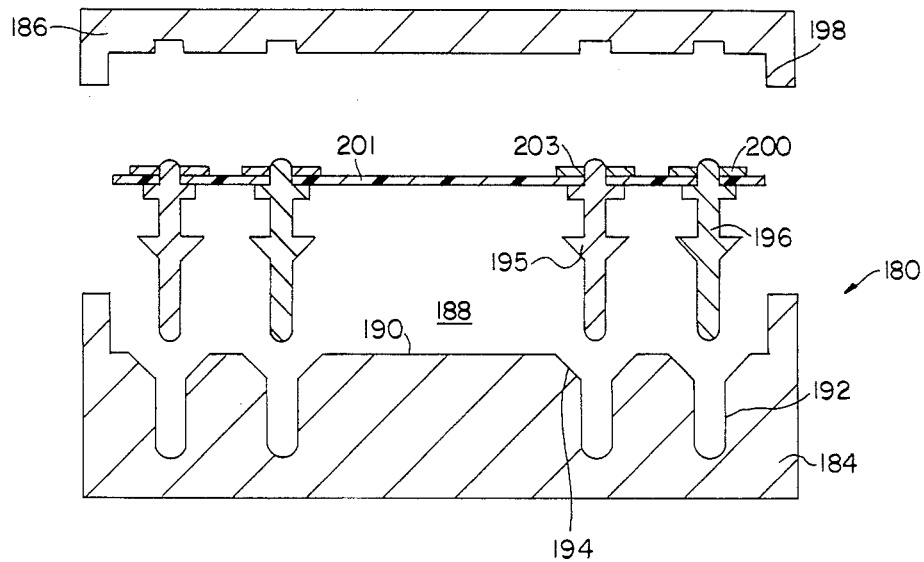
FIGS. 8A through 8D illustrate the series of steps to form a pin grid array adapter package.
Figure 8B:
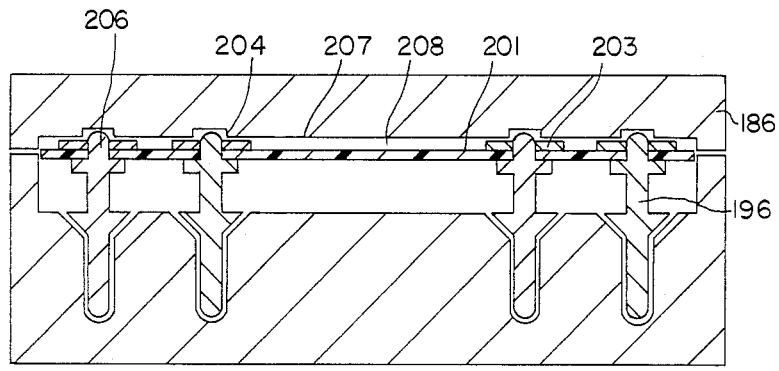
Figure 8C:
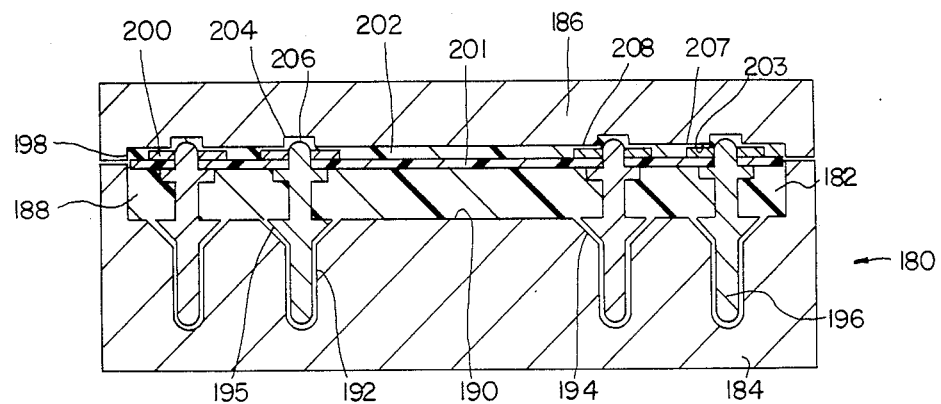
Figure 8D:
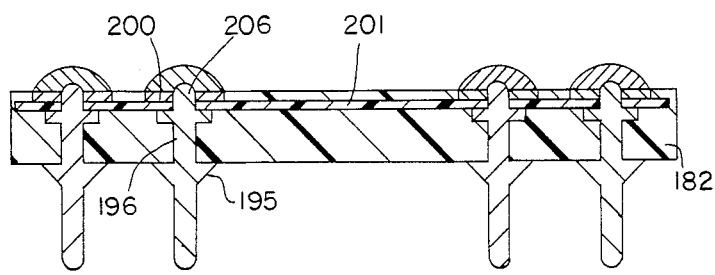

Referring to FIGS. 8A through 8D, there is illustrated the series of steps for constructing an integrated circuit pin grid array adapter package 182. The completed package 182 is illustrated in FIG. 8D. The tape 201 has terminal pins 196 joined thereto and, if desired, bonded by means such as solder 197.

Referring to FIG. 8A, there is illustrated a mold 180 adapted for constructing a pin grid array adapter package 182. As with the molds described hereinbefore, the mold 180 includes a base component 184 and a lid component 186. The base component 184 has a recess 188 with a base surface 190. A plurality of holes 192 project into the base component 184 from the base surface 190. The holes 192 may include cone shaped walls 194 which are sized to receive the cone shaped sections 195 of the terminal pins 196. Pins 196 are substantially identical to the pins 26 described hereinbefore.

Referring to FIGS. 8B and 8C, the cover component 186 includes a shallow recess 198 which is preferably sized to be at least about the thickness of the metal interconnect pattern layer 200 of interconnect tape 201. The interconnect pattern layer 200 is substantially identical with the metal layer 20 of interconnect tape 18 previously described. The tape 201 is inserted into the mold and affixed to the pins 196 in accordance with the principles described hereinbefore. The cover component 186 is constructed to position the tape 201 so that the organic polymer resin 202, which may be selected from the same group as organic resin 78, extends substantially flush with the upper surface 203 of the pattern layer 200. The upper surface of the pattern layer 200 is substantially free from resin 202 in order that the layer 200 can be solder bonded to a semiconductor package, as described herein. This may be accomplished by providing indentations 204 in an inner surface 207 of the mold cover 186 to receive the ends 206 of the pins 196. Then, the upper surface 203 can contact the surface 207 of the cavity 208 and thereby substantially prevent the resin 202 from contacting the surface 203.

The adapter package 182, as seen in FIG. 8D, is formed in the mold 180 using the procedures and concepts described hereinbefore. For example, the pins 196 are inserted through the interconnect tape 201 either before or after insertion into the mold 180. The interconnect tape 201, as illustrated, is exemplary and any desired number or configuration of pins may be incorporated as required for the particular application. The ends 206 of the pins 196 can be bonded with solder 197 to layer 200. This step may be either prior or subsequent to injecting the resin 202 into the mold. Then the polymer resin 202 is injected into the cavity 208 formed between the cover component 186 and the base component 184. As with the embodiments described hereinbefore, the tape 201 can be cut to the desired size by any means either before or after its placement into the mold 180. Then the mold is opened and the adapter package 182 is removed from mold 180.

Figure 9:
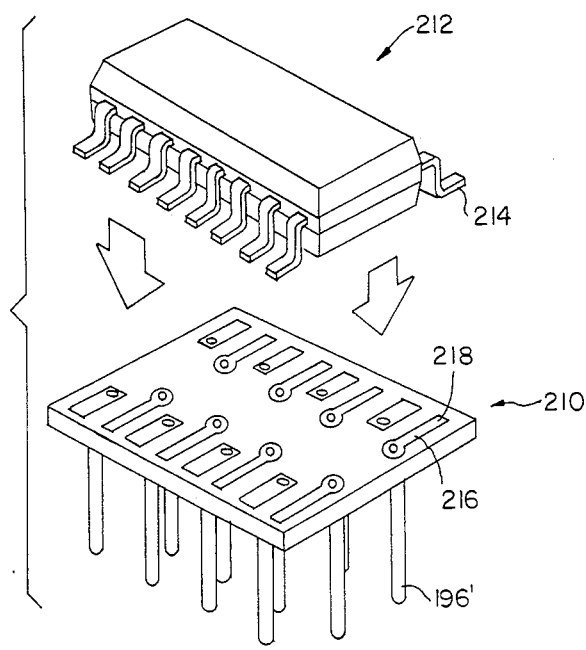
FIG. 9 illustrates a pin grid array adapter package adapted to be soldered to a leaded chip carrier.

An exemplary application of an adapter package 210, which is similar to and constructed in accordance with the principles relating to the construction of package 182, is illustrated in FIG. 9. A dual-in-line semiconductor package 212, having gull-wing shaped leads 214, requires adapting to mount it on a circuit board having pin holes. The package 212 can first be attached to the adapter package 210 by any desired means such as soldering. For example, the leads 214 are soldered to the upper surface 216 of the pattern layer 218. Then the pins 196 of the adapter package 210 can be inserted into a circuit board (not shown).

Figure 10:
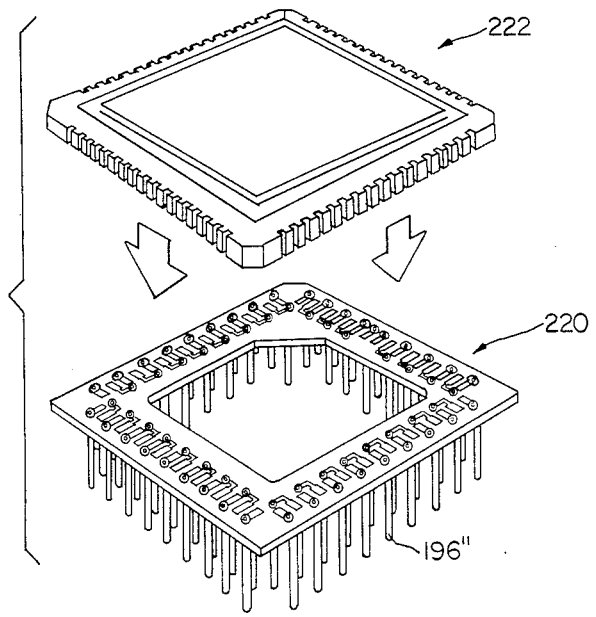
FIG. 10 illustrates a pin grid array adapter package adapted to be soldered to a leadless chip carrier.

Another exemplary application of an adapter package 220, which is similar to and constructed in accordance with the principles relating to the construction of package 182, is illustrated in FIG. 10. A leadless chip carrier 222 requires adaptation to mount it on a circuit board (not shown) having pin holes. The package 222 can first be attached to the adapter package 220 by any desired means such as soldering. Then the pins 196″ of the adapter package 222 can be inserted into the circuit board (not shown).

Although the interconnect tape 18 is described as a TAB construction, it is also within the terms of the present invention to construct the interconnect tape 18 from a metal layer with a dielectric backing such as polyimide glass or epoxy glass.

The patents, application and articles set forth in this application are intended to be incorporated in their entireties by reference herein.

It is apparent that there has been provided in accordance with this invention a process for manufacturing plastic pin grid arrays and the product produced thereby which satisfy the objects, means and advantages set forth hereinabove. While the invention has been described in combination with the embodiments thereof, it is evident that many alternatives, modifications, and variations will be apparent to those skilled in the art in light of the foregoing description. Accordingly, it is intended to embrace all such alternatives, modifications and all variations as fall within the spirit and broad scope of the appended claims.

What is claimed is:

1. The process of forming an integrated circuit pin grid array package, comprising the steps of:
   (a) providing an interconnect tape defining a metal interconnect circuit pattern, said tape having first and second opposing surfaces, said circuit pattern defining a plurality of leads;
   (b) forming a plurality of holes in said metal circuit pattern;
   (c) providing a plurality of terminal pins;
   (d) disposing said interconnect tape into a mold:
   (e) either before or after step (d) a terminal pin through each of said holes whereby said terminal pins extend outward from both the first and second opposing surfaces of said interconnect tape;
   (f) closing the mold so that a cavity is formed about said terminal pins and said tape; and
   (g) molding a polymer resin about said pins and tape to at least partially surround and support said terminal pins and tape, said molding step comprising filling the cavity with said polymer resin.

2. The process of claim 1 wherein said terminal pin includes a pin head disposed at one end of the terminal pin, a shoulder about said terminal pin and a groove between said shoulder and the pin head, said pin head being slightly greater in diameter than said holes so that when said pin head is inserted into said hole, said tape is mechanically locked into said groove.

3. The process of claim 2 including the step of inserting said terminal pins into said holes prior to the step of disposing said interconnect tape into said mold.

4. The process of claim 2 including the step of inserting said terminal pins into said holes subsequent to the step of disposing said interconnect tape in said mold.

5. The process of claim 4 wherein the step of inserting said terminal pins includes the steps of:
   supporting said terminal pins in said mold; and
   pressing said interconnect tape against said terminal pins whereby said terminal pins are inserted into said holes and mechanically locked to said interconnect tape.

6. The process of claim 5 including the steps of:
   providing said terminal pins supported by a plastic carrier;
   inserting said terminal pins and carrier into the mold; and
   removing said carrier from said terminal pins and mold without removing said terminal pins from said mold.

7. The process of claim 2 including the step of bonding said plurality of terminal pins to said metal circuit pattern.

8. The process of claim 7 wherein the step of bonding includes the steps of:
   providing said terminal pins with a solder coating on each of the pin heads;
   providing a solder coating on at least a first surface of said interconnect circuit pattern adjacent each of said plurality of holes; and
   heating said terminal pins and said interconnect circuit pattern to reflow said solder coating on said terminal pins and said metal interconnect circuit pattern to bond said terminal pins to said metal circuit pattern.

9. The process of claim 2 wherein the step of providing said interconnect tape includes the steps of:
   providing said interconnect tape with said metal circuit pattern bonded to a flexible nonmetallic substrate;
   forming a plurality of holes in said nonmetallic substrate overlying said plurality of holes in said metal circuit pattern; and
   forming at least one aperture in said flexible nonmetallic substrate, said aperture arranged so that said leads extend to at least said aperture whereby the leads are adapted to be electrically connected with an integrated circuit device.

10. The process of claim 9 wherein said polymer resin is selected from the group consisting of thermoset and thermoplastic polymer resins.

11. The process of claim 10 wherein said polymer resin is a thermoset polymer resin selected from the group consisting of epoxies, 1-2 polybutadienes, silicone, poly(bismaleimides) and polyimide polymers.

12. The process of claim 10 wherein said polymer resin is a thermoplastic polymer resin selected from the group consisting of polyphenylsulfide, polysulfone, polyarylether, polyamide, polyether ketone, polyethersulfone, polyetherimide and fluoro polymers.

13. The process of claim 10 wherein said step of molding is selected from the group consisting of transfer molding and injection molding.

14. The process of claim 13 wherein said mold includes:
   a base component having a recess with a first base surface, said first surface having a plurality of holes for receiving said terminal pins; and
   a cover component abutting against said base component for enclosing said recess and forming said cavity, said cover component having a first projection extending into said cavity, said first projection having an outer surface for contacting said tape and a central surface to extend through the aperture in said tape whereby said step of molding forms a package having embedded tape and pins with only the portion of the tape surface disposed against the outer surface of the first projection being free of the polymer resin, said package also having a recess adapted to receive an integrated circuit device.

15. The process of claim 14 including the steps of:
inserting an integrated circuit device in said recess;
electrically interconnecting said integrated circuit device to said leads; and
sealing said integrated circuit device within said recess.

16. The process of claim 15 including the steps of:
providing a sealing cap to cover said recess; and
sealing said recess with said cap.

17. The process of claim 13 wherein said mold includes:
a base component having a recess with a first base surface, said first base surface having a plurality of holes for receiving said terminal pins;
said base component having a second projection extending into said cavity for supporting the leads of said tape; and
a cover component abutting agaist said base component for enclosing said cavity, said cover component having a first projection etending into said cavity and abutting against said second projection whereby said step of molding forms a package having embedded tape and pins with a centrally disposed integrated circuit device connect recess extending through the package.

18. The process of claim 17 including the steps of:
constructing said leads to extend over said aperture in cantilever fashion;
inserting an integrated circuit device in said recess;
electrically interconnecting said integrated circuit device to said leads; and
sealing said recess.

19. The process of claim 18 including the steps of:
providing lid and base sealing caps to cover said recess; and
sealing said recess with said caps.

20. The process of claim 13 wherein said mold includes:
a base component having a recess with a first base surface, said first base surface having a plurality of holes for receiving said terminal pins; and
a cover component abutting against said base component for enclosing said recess and forming said cavity whereby said molding step forms a package having the tape and pins embedded in the polymer resin.

21. The process of claim 20 including the steps of:
inserting an integrated circuit device in said recess; and
electrically interconnecting said integrated circuit device to said leads.

22. The process of claim 13 wherein said mold includes:
a base component having a recess with a first base surface, said first base surface having a plurality of holes for receiving said terminal pins; and
a cover component abutting against said base component for enclosing said recess and forming said cavity, said cover component having a plurality of indentations in an inner surface to receive the ends of said terminal pins whereby the upper surface of the metal interconnect circuit pattern contacts the inner surface of said cover component and prevents polymer resin from substantially covering the upper surface of the metal interconnect circuit pattern.

23. The process of claim 22 further including the step of bonding said plurality of terminal pins to said metal circuit pattern.

24. The process of claim 23 including the steps of:
providing an electronic device package having a plurality of leads; and
bonding said plurality of leads to the leads of said metal interconnect circuit pattern.

25. The process of claim 24 wherein said integrated pin grid array package is an adapter adapted to connect said electronic package to a circuit board.

* * * * *

UNITED STATES PATENT AND TRADEMARK OFFICE
CERTIFICATE OF CORRECTION

PATENT NO. : 4,816,426
DATED : March 28, 1989
INVENTOR(S) : Bridges et al

It is certified that error appears in the above—identified patent and that said Letters Patent is hereby corrected as shown below:

Column 11, line 46, after "(d)" please insert ---inserting---.

Column13, line 26, please delete "agaist" and insert ---against---.

Column 13, line 28, please delete "etending" and insert ---extending---.

Signed and Sealed this

Fifth Day of May, 1992

Attest:

DOUGLAS B. COMER

Attesting Officer     Acting Commissioner of Patents and Trademarks